United States Patent
Felcman et al.

(10) Patent No.: US 8,046,196 B2
(45) Date of Patent: Oct. 25, 2011

(54) MODULAR NETWORKED SENSOR ASSEMBLY

(75) Inventors: Chris F. Felcman, Spring, TX (US); David A. Moore, Tomball, TX (US); Gary S. Landrum, Montgomery, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 409 days.

(21) Appl. No.: 12/114,673

(22) Filed: May 2, 2008

(65) Prior Publication Data

US 2008/0208531 A1    Aug. 28, 2008

Related U.S. Application Data

(62) Division of application No. 11/043,317, filed on Jan. 26, 2005, now Pat. No. 7,383,691.

(51) Int. Cl.
*G21C 17/00* (2006.01)
(52) U.S. Cl. ....... 702/188; 702/182; 702/73; 340/693.5; 361/695; 29/592.1
(58) Field of Classification Search .................... 702/73, 702/35, 182, 188; 340/693.5, 539.1, 539.11, 340/539.23, 572.1; 361/272, 695, 600, 679.01; 29/592.1
See application file for complete search history.

(56) References Cited

U.S. PATENT DOCUMENTS

| | | | | |
|---|---|---|---|---|
| 5,157,255 A * | 10/1992 | Kornrumpf et al. | ....... | 250/252.1 |
| 6,529,127 B2 * | 3/2003 | Townsend et al. | ............ | 340/505 |
| 6,859,882 B2 * | 2/2005 | Fung | .............................. | 713/300 |
| 7,185,287 B2 * | 2/2007 | Ghercioiu et al. | .............. | 715/771 |
| 7,339,490 B2 * | 3/2008 | Moore et al. | ................. | 340/693.5 |
| 7,383,691 B2 * | 6/2008 | Felcman et al. | ............. | 62/259.2 |
| 7,490,637 B2 * | 2/2009 | Speasl et al. | ..................... | 141/98 |
| 7,591,187 B2 * | 9/2009 | Hamel | ............................ | 73/778 |
| 7,639,135 B2 * | 12/2009 | Arms et al. | ................. | 340/572.1 |
| 2002/0187025 A1 * | 12/2002 | Speasl et al. | ................... | 414/287 |
| 2003/0046339 A1 * | 3/2003 | Ip | .................................. | 709/203 |
| 2003/0224553 A1 * | 12/2003 | Manansala | .................... | 438/106 |
| 2005/0024826 A1 * | 2/2005 | Bash et al. | ..................... | 361/695 |
| 2005/0284535 A1 * | 12/2005 | Speasl et al. | ...................... | 141/1 |
| 2006/0162364 A1 * | 7/2006 | Felcman et al. | ............. | 62/259.2 |

* cited by examiner

*Primary Examiner* — Carol Tsai

(57) ABSTRACT

In a network sensor assembly, network environmental monitor, and associated fabrication methods, a network sensor assembly comprises a panel configured for mounting on a surface, a plurality of addressable sensors coupled to the panel that sense environmental conditions at the surface, a memory device that stores configuration information associated with the plurality of addressable sensors, and a bus. The bus is communicatively coupled to the plurality of addressable sensors and the memory device and is configured for communicatively coupling the network sensor assembly to a network node for communicating data associated with the sensed environmental conditions in a network.

20 Claims, 12 Drawing Sheets

MODULAR NETWORKED SENSOR ASSEMBLY

BACKGROUND

1. Field of the Invention

A sensor system is operable to monitor environmental conditions within a data center.

2. Related Art

A data center may be defined as a location, e.g., a room that houses numerous printed circuit (PC) board electronic systems arranged in a number of racks. A standard rack may be defined as an Electronics Industry Association (EIA) enclosure, 78 in. (2 meters) high, 24 in. (0.61 meter) wide and 30 in. (0.76 meter) deep. Standard racks may be configured to house a number of PC boards, e.g., about forty (40) PC server systems, with some existing configurations of racks being designed to accommodate up to 280 blade systems. The PC boards typically include a number of components, e.g. processors, micro-controllers, high speed video cards, memories, and the like, that dissipate relatively significant amounts of heat during the operating of the respective components. For example, a typical PC board comprising multiple microprocessors may dissipate approximately 250 W of power. Thus, a rack containing forty (40) PC boards of this type may dissipate approximately 10 KW of power.

The power required to remove the heat dissipated by the components in the racks is generally equal to about 10 percent of the power needed to operate the components. However, the power required to remove the heat dissipated by a plurality of racks in a data center is generally equal to about 50 percent of the power needed to operate the components in the racks. The disparity in the amount of power required to dissipate the various heat loads between racks and data centers stems from, for example, the additional thermodynamic processing needed in the data center to cool the air.

Equipment or computer racks are typically cooled in bulk with fans that move cooling fluid, e.g., air, across the heat dissipating components. Additionally, data centers often implement reverse power cycles to cool heated return air. The additional work required to achieve the temperature reduction, in addition to the work associated with moving the cooling fluid in the data center and the condenser, often add up to the 50 percent power requirement. As such, the cooling of data centers presents problems in addition to those faced with the cooling of racks.

Conventional data centers are typically cooled by operation of one or more air conditioning units. The compressors of the air conditioning units typically require a minimum of about thirty (30) percent of the required cooling capacity to sufficiently cool the data centers. The other components, e.g., condensers, air movers (fans), etc., typically require an additional twenty (20) percent of the required cooling capacity. As an example, a high density data center with 100 racks, each rack having a maximum power dissipation of 10 KW, generally requires 1 MW of cooling capacity.

Air conditioning units with a capacity of 1 MW of heat removal generally require a minimum of 30 KW input compressor power in addition to the power needed to drive the air moving devices, e.g., fans, blowers, etc. Conventional data center air conditioning units do not vary their cooling output based on the distributed needs of the data center. Instead, these air conditioning units generally operate at or near a maximum compressor power even when the heat load is reduced inside the data center.

The substantially continuous operation of the air conditioning units is generally designed to operate according to a worst-case scenario. Cooling is supplied to the components at around 100 percent of the estimated cooling requirement. In this respect, conventional cooling systems often attempt to cool components that may not need to be cooled. Consequently, conventional cooling systems often incur greater amounts of operating expenses than may be necessary to sufficiently cool the heat generating components by continuously supplying 100 percent of the worst case estimated cooling requirement.

SUMMARY

In various embodiments, a network sensor assembly, network environmental monitor, and associated fabrication methods, a network sensor assembly comprises a panel configured for mounting on a surface, a plurality of addressable sensors coupled to the panel that sense environmental conditions at the surface, a memory device that stores configuration information associated with the plurality of addressable sensors, and a bus. The bus is communicatively coupled to the plurality of addressable sensors and the memory device and is configured for communicatively coupling the network sensor assembly to a network node for communicating data associated with the sensed environmental conditions in a network.

BRIEF DESCRIPTION OF THE DRAWINGS

For a more complete understanding of the present invention and the advantages thereof, reference is now made to the following description of embodiments of the invention taken in conjunction with the accompanying drawings in which like reference numerals indicate like features and wherein.

DETAILED DESCRIPTION

Figure 1:
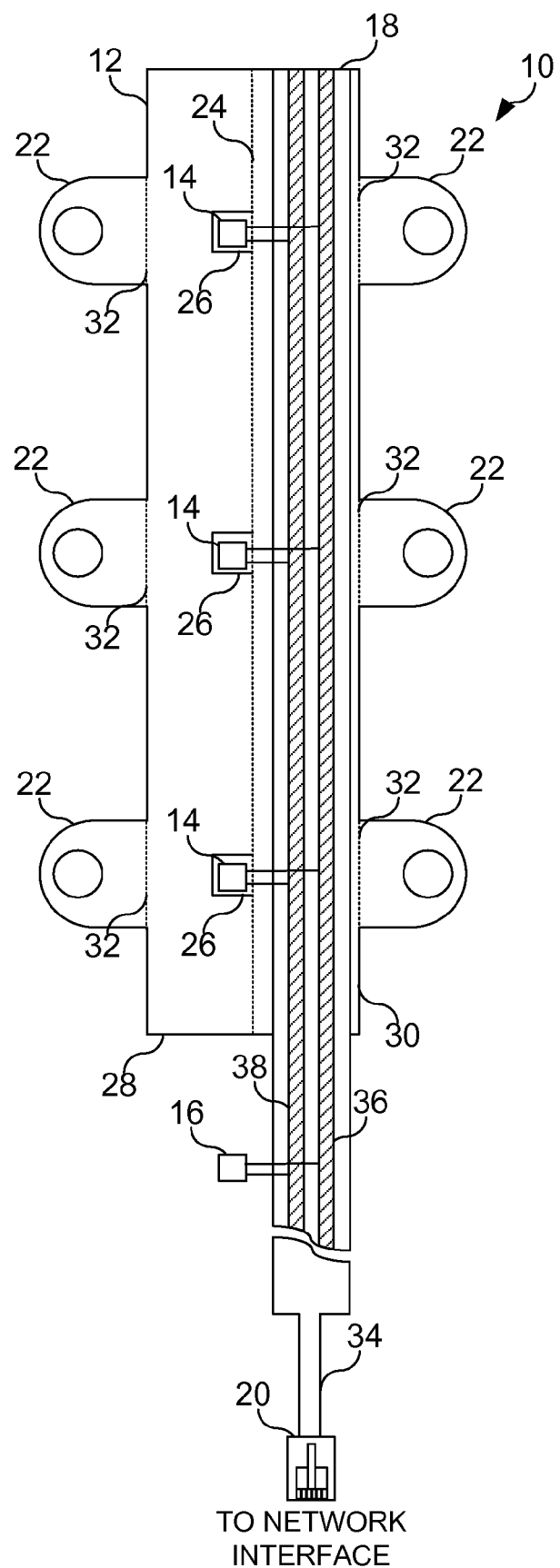
FIG. 1 is a diagram of a partially assembled modular sensory assembly in accordance with an embodiment of the invention.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the invention as illustrated herein, which would occur to one skilled in the relevant art and having possession of this disclosure, are to be considered within the scope of the invention.

It has now been discovered a need exists to develop a distributed network of sensors that is simple to install on new or existing equipment rack systems, and that provides a low cost sensor assembly for deploying multiple sensors over a widely distributed area.

FIG. 1 depicts an embodiment of sensor assembly 10. Sensor assembly 10 includes flexible body 12, a number of sensors 14, memory device 16, common bus 18, and data connector 20. Flexible body 12 further includes a number of mounting tabs 22 and sensor tabs 26. Flexible body 12 may be folded along fold line 24, which divides flexible body 12 into first panel 28 and second panel 30. Sensor tabs 26 are formed from cutouts within the flexible body and are located proximate to sensors 14. Mounting tabs 22 hingedly attach to flexible body 12 at fold lines 32. In one embodiment, the mounting tabs may mechanically couple flexible body 12 to the front panel of an equipment rack with pop rivets, adhesive, mechanical fasteners, or other like fastening systems known to those skilled in the art.

Sensors 14 may sense or monitor various environmental conditions. These conditions include temperature, pressure, humidity, air velocity, smoke sensors, airborne particulate, hazardous gasses, occupancy sensors, equipment door condition, sound, light, ultraviolet, electromagnetic energy or other like conditions known to those skilled in the art. This wide variety of sensors allows equipment or materials stored in the monitored environment to be operated/stored as allowed by the environmental conditions. Alternatively, the environmental conditions may be adjusted based on this information. Although one embodiment addresses the operation of HVAC to support rack mounted equipment, these sensors may be applied to monitor and control environmental conditions of perishable items such as food and medicine, incubators, climate controlled archives (i.e., for rare first edition publications) or other like uses known to those having skill in the art.

Figure 2:
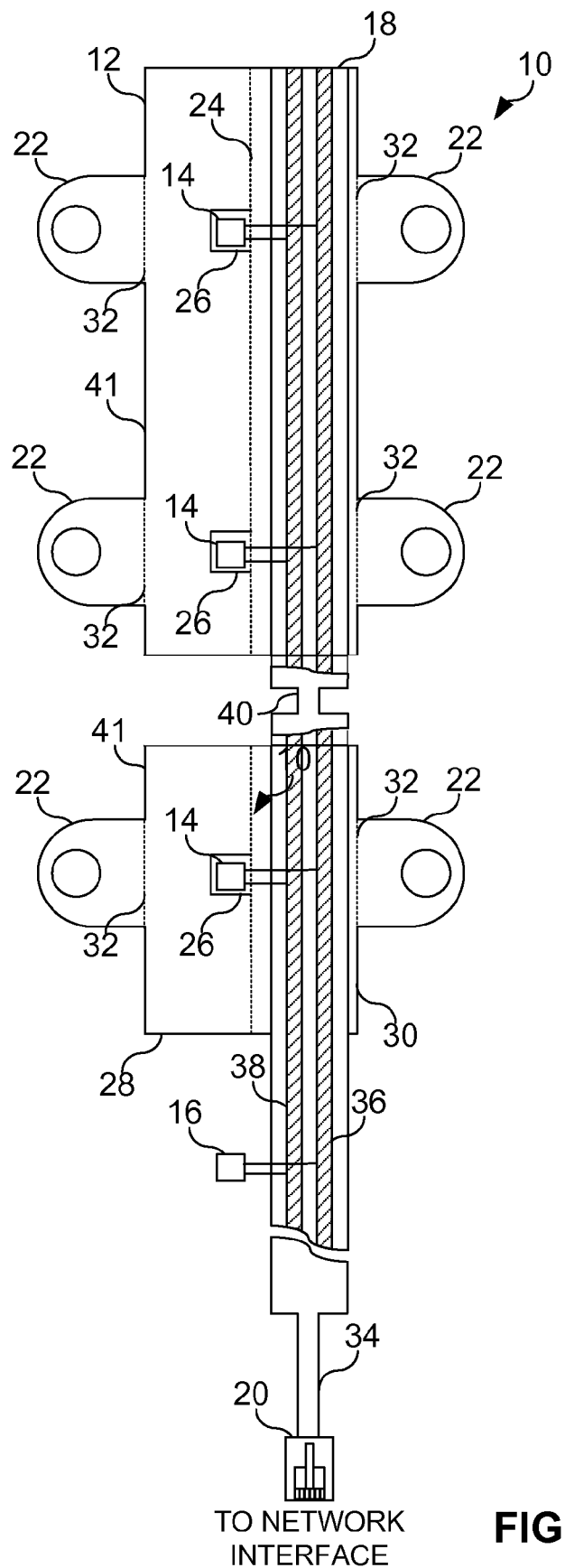
FIG. 2 is a diagram of a modular sensory assembly in accordance with a second embodiment of the invention.

Sensors 14 and memory device 16 communicatively couple to common bus 18. As shown in FIG. 1, common bus 18 may be a ribbon wire having two conductors, 36 and 38. Sensors 14 sense environmental conditions such as, but not limited to, temperature, humidity, air pressure, air velocity, smoke sensors, occupancy sensors, rack door condition, sound, and light. Common bus 18 couples to conductor wire 34, such as, but not limited to, a flat phone-type wire that extends from one end of common bus 18 and terminates in data connector 20. As shown, data connector 20 may be a telephone-type modular connector that allows the connector wire to be interconnected to a computer network so that the data, such as temperature, humidity, air pressure, etc., can be communicated from the sensors to the network. The sensor assembly can be substantially continuous, as shown in FIG. 1 or may include multiple segments that are interconnected by an intermediate connector wire 40, as shown in FIG. 2.

Figure 3:
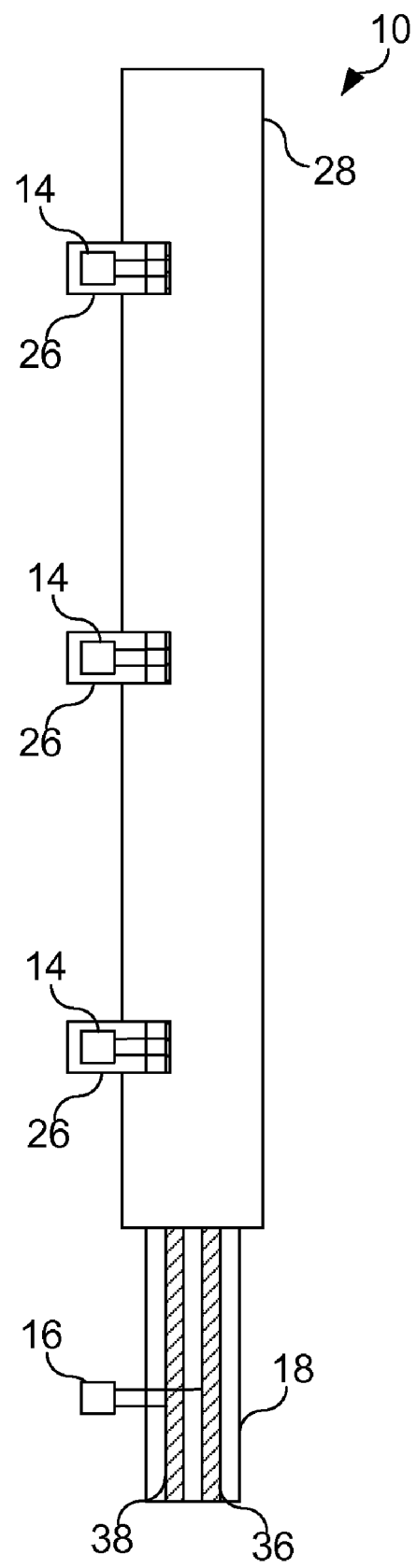
FIG. 3 is a diagram of the modular sensory assembly of FIG. 1 folded along a central foldline in accordance with an embodiment of the invention.

FIG. 3 depicts network sensor assembly 10 wherein first panel 28 has been folded over onto second panel 30. This clearly shows that sensor tabs 26, as cut out from first panel 28, are positioned to provide support to sensors 14. In this way, sensor tabs 26 can support and protect sensors 14 from inadvertent disorientation or damage.

Figure 4A:
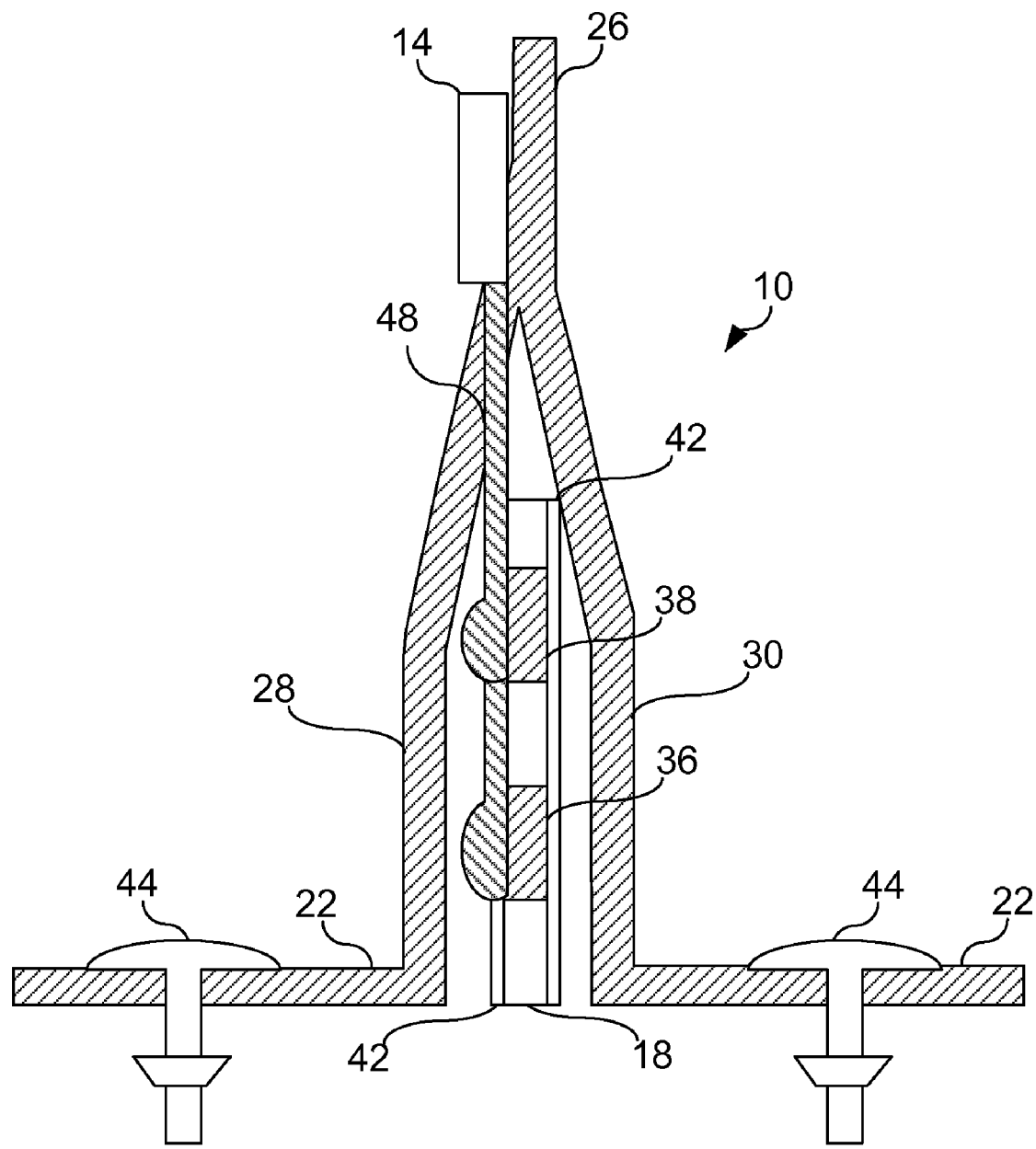
FIG. 4A is a cross-section of a modular sensory assembly in accordance with an embodiment of the invention.

FIG. 4A provides a cross-section of network assembly 10. Here, it is shown that common bus 18 is located in between first panel 28 and second panel 30. Common bus 18 may be secured with adhesive 42 to form a layer on either side of conductor tape 18. A release liner, not shown, may be initially on ribbon tape used as common bus 18 wherein the release liner is removed to secure the ribbon tape to the flexible body. In such an example, common bus 18 would first be secured to panel 30, and once panel 28 had been folded over panel 30, the second release liner may be removed in order to mechanically couple the ribbon wire to the second panel. Folding panel 28 onto panel 30 results in a peaked roof, bending at a point. Sensor tabs 26 continue from the panels in a straight line. As shown, sensor 14 is coupled to the ribbon wire with leads 48. Leads 48 couple sensor 14 to the conductor wire, and may establish electrical contact electrically coupling (i.e., soldering, crimping, welds, conductive adhesive, or other like means known to those having skill in the art) individual leads 48 to flat conductors 38 and 36 within the ribbon wire of the common bus. Push rivets 44 or other like mechanical fastener may be used to secure mounting tabs 22 to the computer rack as will be discussed further in FIGS. 5 and 6.

Figure 4B:
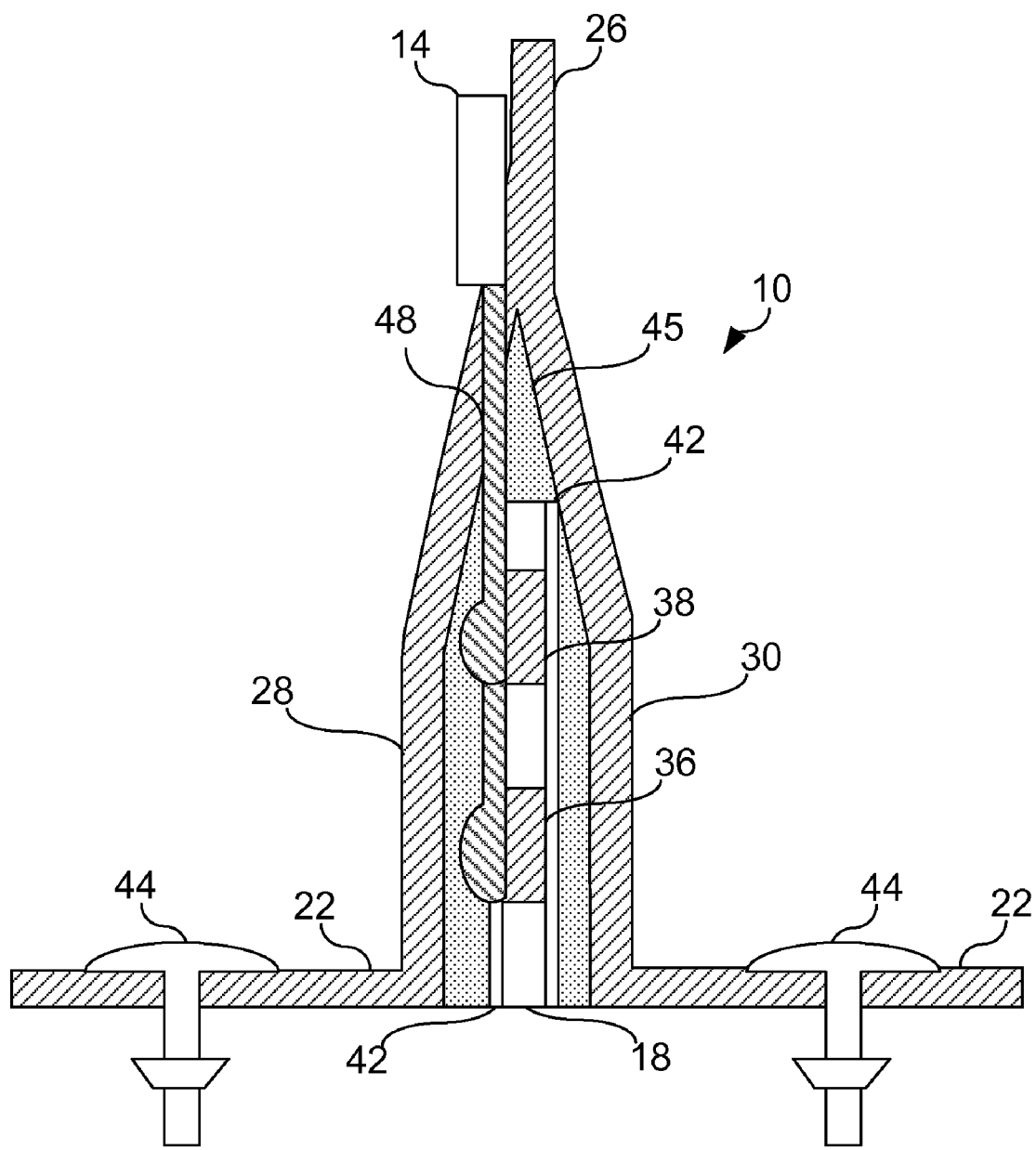
FIG. 4B is a cross-section of a second modular sensory assembly that incorporates cushioning materials within the structure in accordance with an embodiment of the invention.

FIGS. 4A and 4B shows the internal structure of sensor assembly 10. Sensor assembly 10 generally includes several layers of material laminated together to form a rugged but flexible assembly. Sensor assembly 10 includes outer walls (first panel 28 and second panel 30 of flexible body 12), to which the other components are attached. In one embodiment, flexible body 12 can be a 0.010" thick plastic strip 0.75" wide.

Rugged plastic tape may also be used as adhesive layer 42 to secure common bus 18. Common bus 18 may be conductive tape wire, such as copper foil tape with an adhesive backing. Conductive foil or flex circuit tape can be used, such as copper tape foil CK1017 from Cir-Kit Concepts Inc. While two flat conductors 36 and 38 are shown in the depicted embodiment, the sensor assembly is not limited to two, for reasons that are discussed below. In one embodiment, conductors 36 and 38 represent a data line and ground line.

Sensor 14 is electrically coupled to conductors 36 and 38 via leads 48. Each sensor 14 includes at least two leads 48. One lead serves as a data connection lead while the other lead serves as a ground connection lead. The data connection lead connects the sensor to computer controller 110, shown in FIG. 6. The ground connection lead and the data connection lead can be configured either in one long wire pair, as shown, with multiple sensors in parallel. There are a variety of sensor types and sensor products that can be used. One type of temperature sensor that may employ is a Dallas Semiconductor/Maxim integrated circuits DS18S20-PAR sensor. The sensor assembly can also be used to deploy other digital transducers or sensors with similar connectivity requirements but differing functionalities, such as transducers and sensors for detecting fluid (air) pressure, fluid velocity, humidity, occupancy, light, smoke, door condition, etc. Multiple or redundant conductor assemblies can be developed to address connectivity requirements of a wide variety of transducers and provide customization (or upgrades). The sensor assembly can also be used beyond the rack assembly, for other non-rack related sensors like pressure transducers inside a plenum or temperature sensors for vents.

Power for the sensor 14 may be parasitically drawn from the data line. Specifically, the sensor may include an internal capacitor, which draws power and charges during data line inactivity. Alternatively, a sensor without an internal capacitor could be used. Such a sensor could include three leads, one of which would be connected to a power supply line (not shown) that would be separate from the data and ground lines. Thus, such a system would require a third conductor line, in addition to the data line and ground line shown in the FIGs.

In the embodiment shown, sensor 14 is configured to measure ambient temperature a small distance, (for example one implementation uses 15 mm) from sensor assembly 10, and convert the temperature reading into a digital signal. One advantage of implementing this type of sensor is that a central instrument is not needed. Each sensor is capable of independently converting physical temperature data to transmittable digital data. This eliminates the need to carry sensitive analog signals from point to point. The digital data provided by the sensor can be protected by cyclic redundancy check (CRC) algorithms that prevent distortion of the data.

Common bus 18 is a multiple conductor wire. As shown, the ribbon wire used as common bus 18 includes two conductors 36 and 38, the ends of which are electrically coupled to the ends of leads 48 to provide connectivity to the sensors. One conductor is the data line, and the other conductor is the ground line. Where sensors 14 include more than two leads, the common bus will also include more than two corresponding conductors.

Memory device 16 is configured to contain configuration and identification information related to sensors 14 that are attached to sensor assembly 10. Memory device 16 may be a single memory device or a plurality of memory devices. Such a memory device may be a read-only memory, random access memory, volatile memory, non-volatile memory, static memory, dynamic memory, flash memory, cache memory, and/or any device that stores digital information. In one embodiment, memory device 14 can be an EEPROM device that includes a memory table with the identification information for each sensor. Specifically, in one embodiment, each Dallas Semiconductor DS18S20-PAR sensor has a unique factory-assigned 64 bit identification code or address. The memory device can be configured to retain in memory the addresses of each sensor disposed downstream, so as to speed the collection of data. This configuration advantageously provides a two-conductor physical interface with a large address space.

Alternatively, the identification of each sensor 14 can be prescribed with a much smaller address, such as that used by I2C devices. However, this configuration requires at least four conductors on the sensor assembly, and also requires wiring (e.g. printed circuits) with passive components at each sensor for retaining address settings. Alternatively, a user-defined identification code for each sensor (rather than a factory-assigned code) can be prescribed and recorded in memory device 16, the memory device being factory-set with the user-defined identification codes. As provided by yet another alternative, a processor within the network node or central computer 110 of FIG. 10 can be programmed with each sensor address in order to accurately collect and interpret the sensor data.

Sensor assembly 10 may include a number of other features for ruggedness, durability, and convenience. For example, a first protective cover, such as a section of shrink tubing, may cover leads 48 of sensor 14. A second protective cover, such as shrink tubing, may be used to substantially cover the sensor, leaving a small portion of the sensor protruding. A small piece of cushioning material, such as ⅛" thick double faced foam tape, may be positioned about the second protective cover around sensor 14, and a similar piece of cushioning material may be provided around common bus 18 and memory device 16. These protective covers, cushioning material, sensor tabs 26 and similar features serve as strain relief and protective coverings for the various components, helping to prevent damage to sensors 14, memory device 16, common bus 18, and related electrical connections. The functions of these features may be performed by alternate means known to those skilled in the art. An adhesive or adhesive layer, such as thin double-sided adhesive tape (not shown), can be applied to the exterior sides of common bus 18 to secure the first panel 28, second panel 30 and common bus 18 between optional sections of cushioning material 45.

Sensor assembly 10 may be positioned within a molding or other elongate protective structure, such as a channel. This channel may include multiple openings to allow individual sensors 14 of the sensor assembly to protrude through to the outer environment. The molding or channel to be discussed further with reference to FIGS. 7 and 8, may be of aluminum, plastic, or any other suitable material. The molding can provide a decorative trim piece for the equipment rack, and can be configured to attach to the inside or outside of the rack.

Other configurations and materials can also be used for the sensor assembly. For example, flexible body 12 may be formed from a semi-rigid material that can be adhered directly to a continuous layer 45 of internal cushioning material. Flexible body 12 can be made from plastic, aluminum, or other material comprising a decorative molding or trim piece. Integral snap rivet 44 accommodates mounting of the sensor assembly to computer rack 60.

Figure 5:
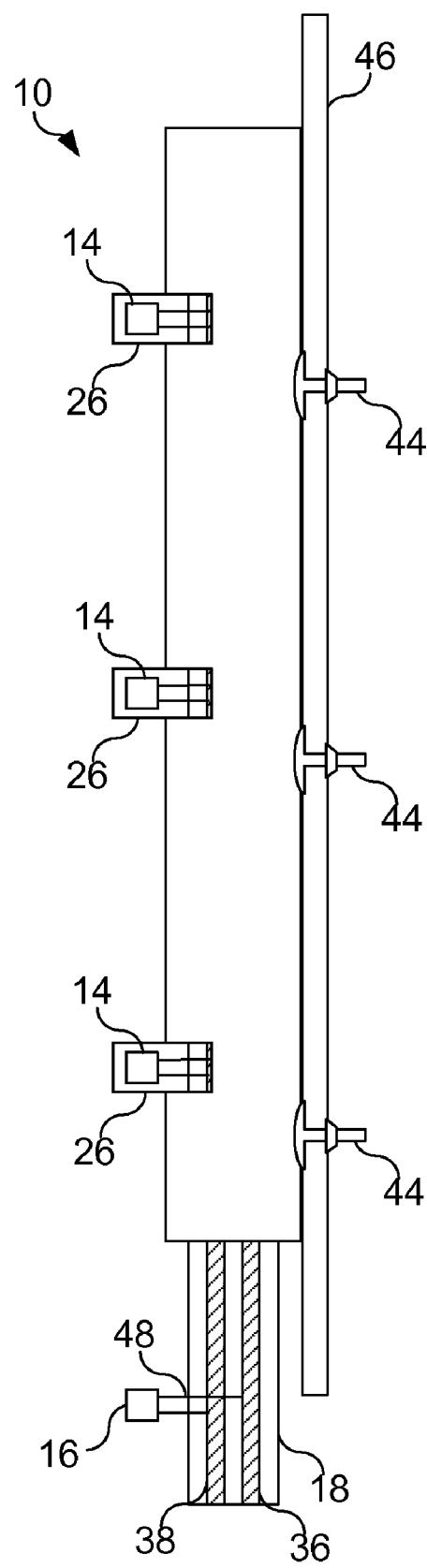
FIG. 5 is a side view a modular sensory assembly attached to a computer or equipment rack in accordance with an embodiment of the invention.
Figure 6:
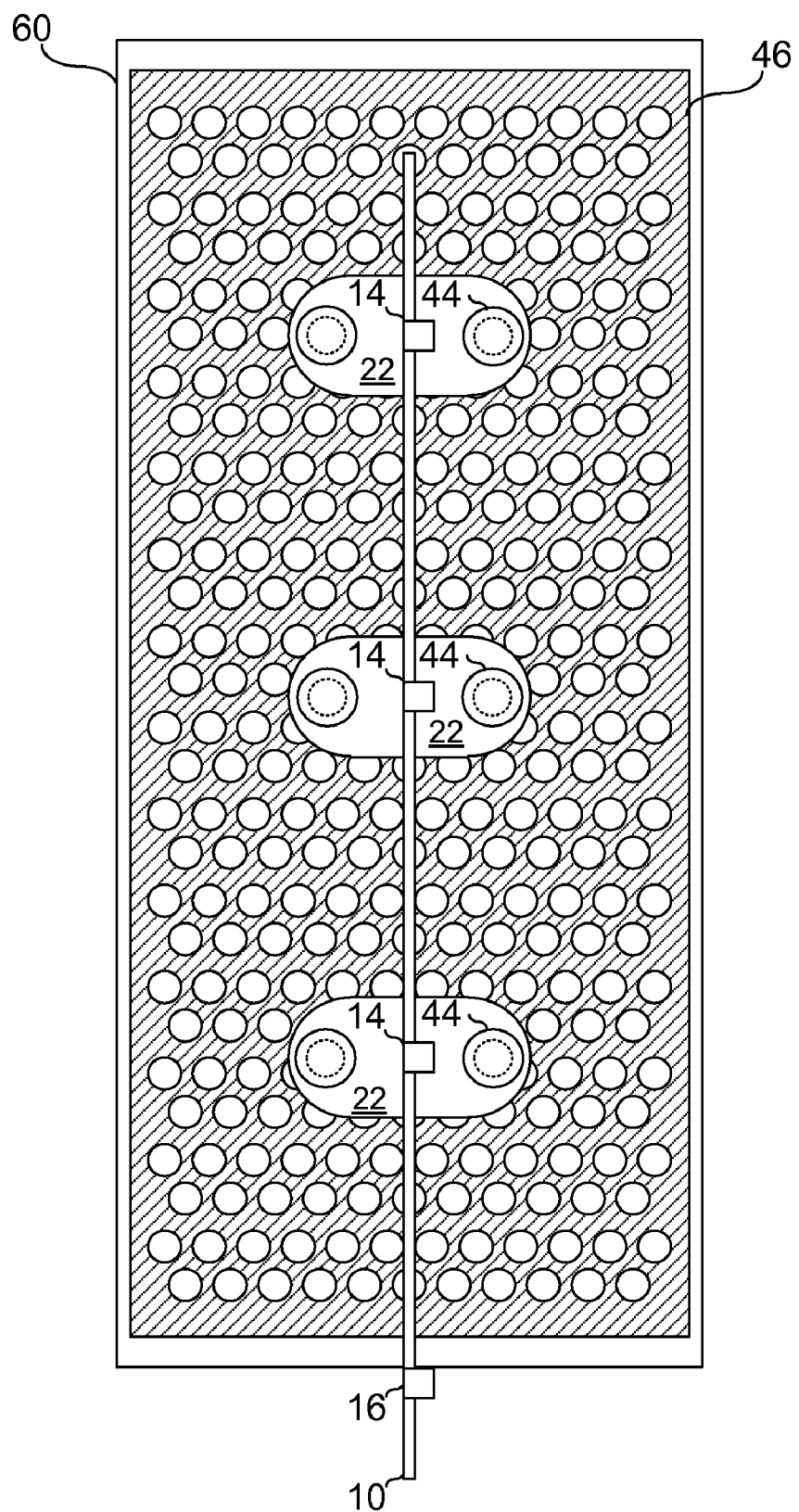
FIG. 6 is a front view a modular sensory assembly attached to a computer or equipment rack in accordance with an embodiment of the invention.

FIG. 5 shows a cross-section of exterior panel 46 of a computer rack wherein network assembly 10 is mounted onto the exterior panel of the computer rack. Push rivets 44 pass through openings on mounting tabs 22 to secure sensor assembly 10 to exterior panel 46 of the computer rack. FIG. 6 provides a front view that shows computer rack 60 having exterior panel 46 wherein sensor assembly 10 is mounted with a low profile on exterior panel 46. This low profile reduces any obstruction to airflow within computer rack 60 caused by the sensor assembly 10.

Figure 7:
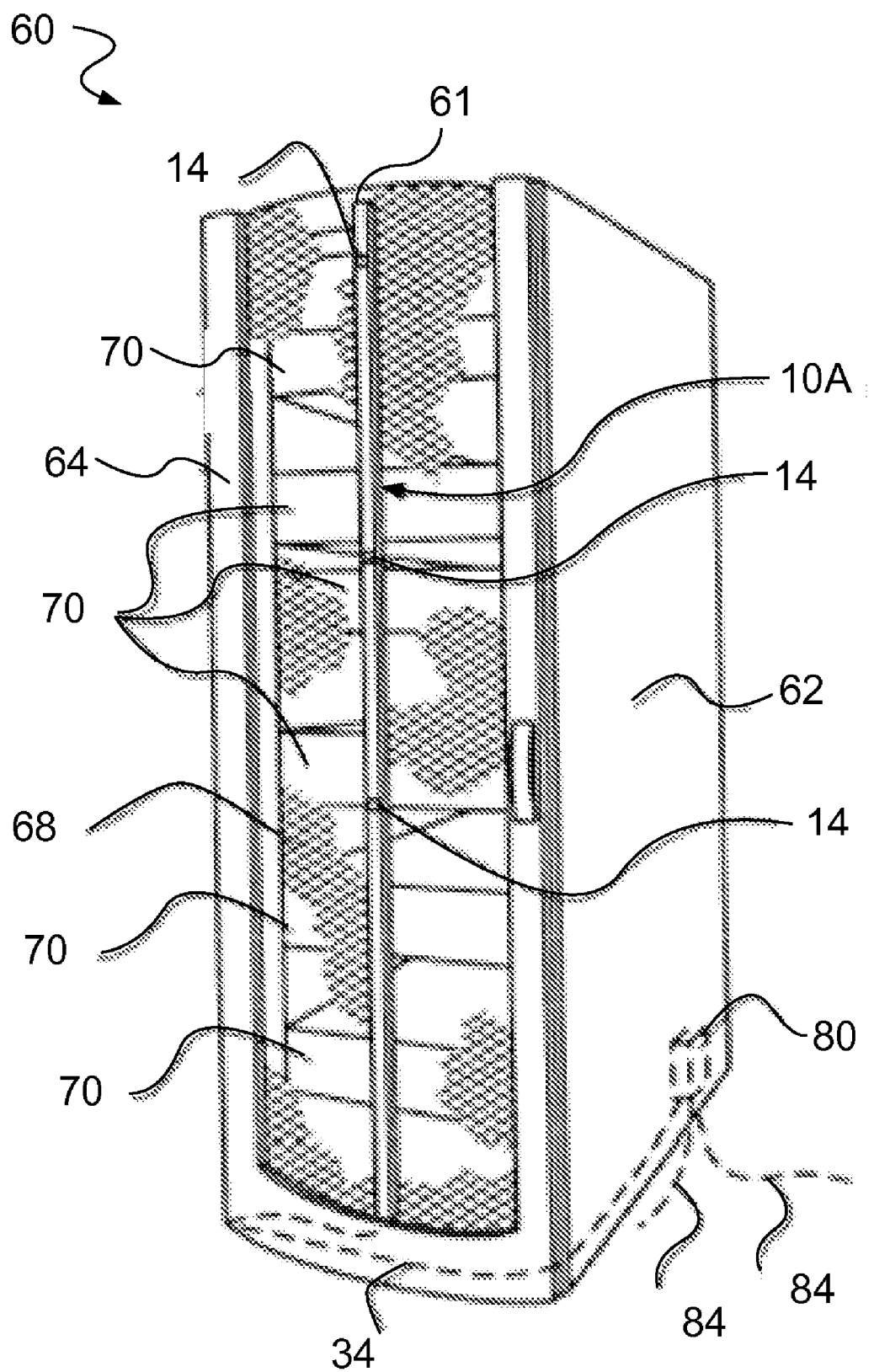
FIG. 7 is a front perspective view of one embodiment of an electronics rack configured with a sensor assembly in accordance with an embodiment of the invention.
Figure 8:
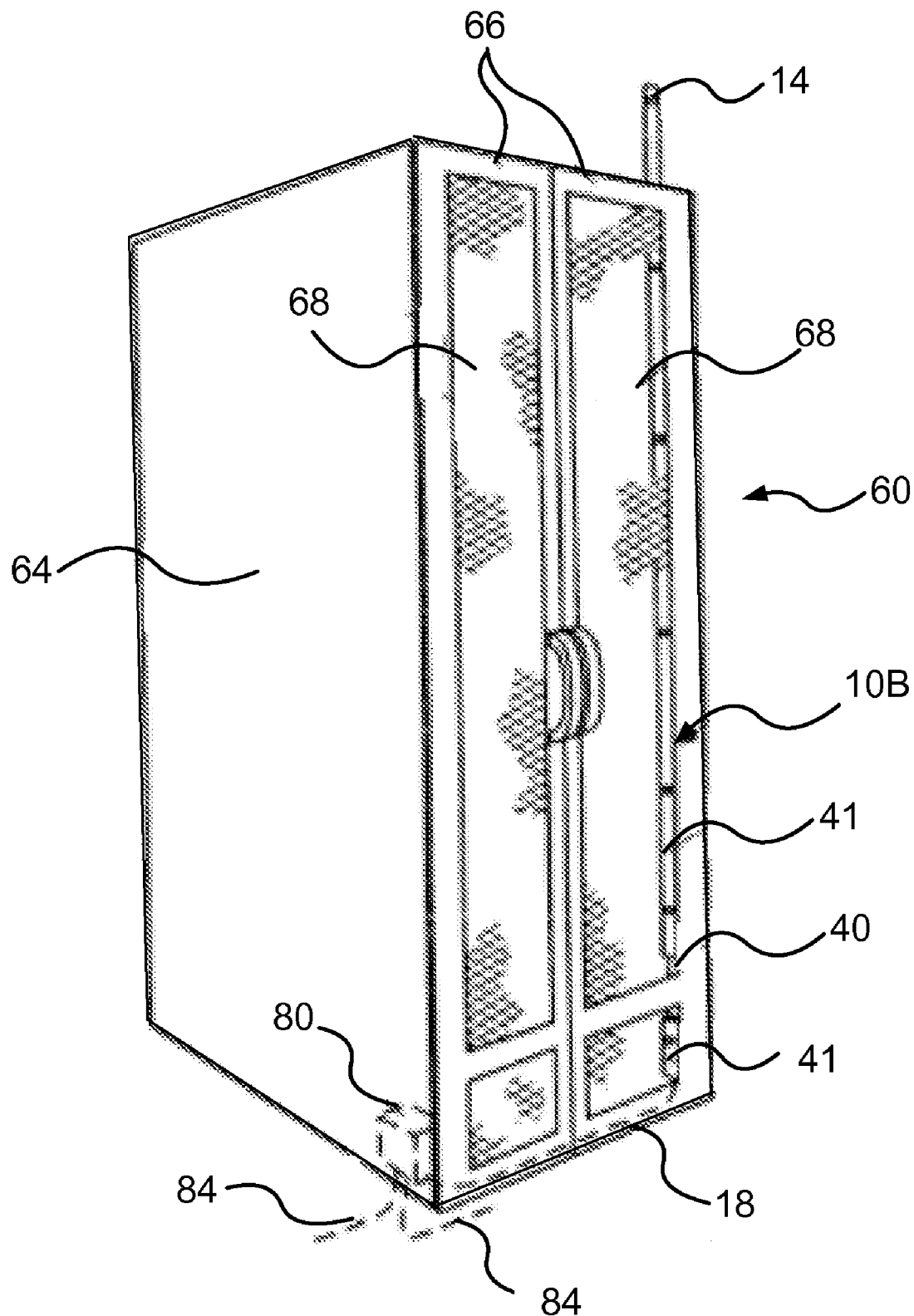
FIG. 8 is a rear perspective view of one embodiment of an electronics rack configured with a sensor assembly in accordance with an embodiment of the invention.

Depicted in FIGS. 7 and 8 are front and rear perspective views of one embodiment of an electronics rack 60 configured with sensor assemblies 10. There are a variety of equipment racks that are commercially available, and the application of the sensor assembly is not limited to compatibility with just one variety. The rack can be configured in various ways, and is not limited to the configuration shown. The rack shown in the drawings generally comprises upright body 62, with access door 64 on its front and a pair of access doors 66 on the back. The front and rear doors include a screen, mesh, or perforated panel such as the exterior panel discussed with reference to FIGS. 5 and 6 that allows air to flow through the panel while allowing users to view components and hardware inside.

Computer rack 60 houses a plurality of components 70, e.g., processors, micro-controllers, high speed video cards, memories, semi-conductor devices, and the like. The components may be elements of a plurality of subsystems (not shown), e.g., computers, servers, etc. In the performance of their electronic functions, the components, and therefore the subsystems, generally dissipate relatively large amounts of heat. Because computer rack systems have been generally known to include upwards of forty (40) or more subsystems, the computer racks often require substantial amounts of cooling to maintain the subsystems and the components generally within a predetermined operating temperature range. Additionally, the temperature of cooling air supplied by a data center cooling system is likely to vary based on distance between the cooling equipment and the computer rack. Accordingly, temperature readings associated with the operation of the computer rack are gathered at multiple points in the vertical and horizontal directions.

Sensor assembly 10 can be configured to fit onto installation features built into computer rack 60. For example, the front sensor assembly 10A, shown in FIG. 7 is a continuous sensor assembly installed on a cosmetically pleasing trim strip 61 mounted on perforated panel 68 of front door 64 of computer rack 60. Sensor assembly 10 includes three sensors 14, for obtaining a measurement of inlet air temperature from near the bottom to the top of the rack. If the rack does not include a front door, sensor assembly 10 can be installed on or in trim strip 61 at an edge of the front of computer rack 60.

As shown in FIG. 8, rear sensor assembly 10B can be designed to mount within the rear cavity of computer rack 60, inside one of rear doors 66. Alternatively, sensor assembly 10 could be configured to mount on the rear mounting channels. Cosmetic appearance is not as important in the rear of computer rack 60, but mounting flexibility is. There are typically many obstructions in this area, and mounting of a continuous sensor assembly may be difficult. For this reason, rear sensor assembly 10B shown is configured like that of FIG. 2, comprising more than one sensor sections 41, interconnected by flexible connector wire 40. The flat sensor sections make installation simple, and intermediate connector wire 40 provides for routing around obstacles, such as the cross bar of the rack door, etc.

It is also notable that the rear sensor assembly 10B includes an overhead sensor positioned to extend above computer rack 60. This configuration can be accommodated in various ways. For example, where the sensor assembly is disposed inside rear doors 66, the overhead portion of the sensor assembly can be a discontinuous portion that is connected to the remainder of the assembly via a connector wire. This wire can extend unobtrusively between adjacent door 66 and the body of computer rack 60. The overhead portion of the sensor assembly can be attached to additional support structure, such as an upright rod associated with computer rack 60. Alternatively, the overhead portion of the sensor assembly may include a support member. Other configurations are also possible to provide for overhead sensors.

Sensor assemblies 10 are designed to facilitate easy mounting on an equipment or computer rack, either at the factory before shipment to the customer, or at the customer site for installation as an option. This is accomplished by building mounting features into the equipment rack operable to accommodate sensor assemblies 10. These features can be in the form of a channel or series of holes in the surface of the rack (designed to receive snap rivets 44 or other like connectors), and are designed to fit mounting provisions on the rack. When a sensor assembly is not installed at a given location that is configured to receive one, a compatible blank trimming strip can be installed at that location to cover the exposed mounting locations. In this way a cosmetically appealing appearance can be maintained whether or not the sensor assembly is installed.

Mounting point features designed into equipment racks facilitate installation of sensor assembly 10. The sensor assemblies may also be retrofitted onto racks without mounting features by using adhesive or other means of mechanically coupling to secure sensor assembly 10 to the equipment rack One such means employs double-sided adhesive tape.

Figure 9:
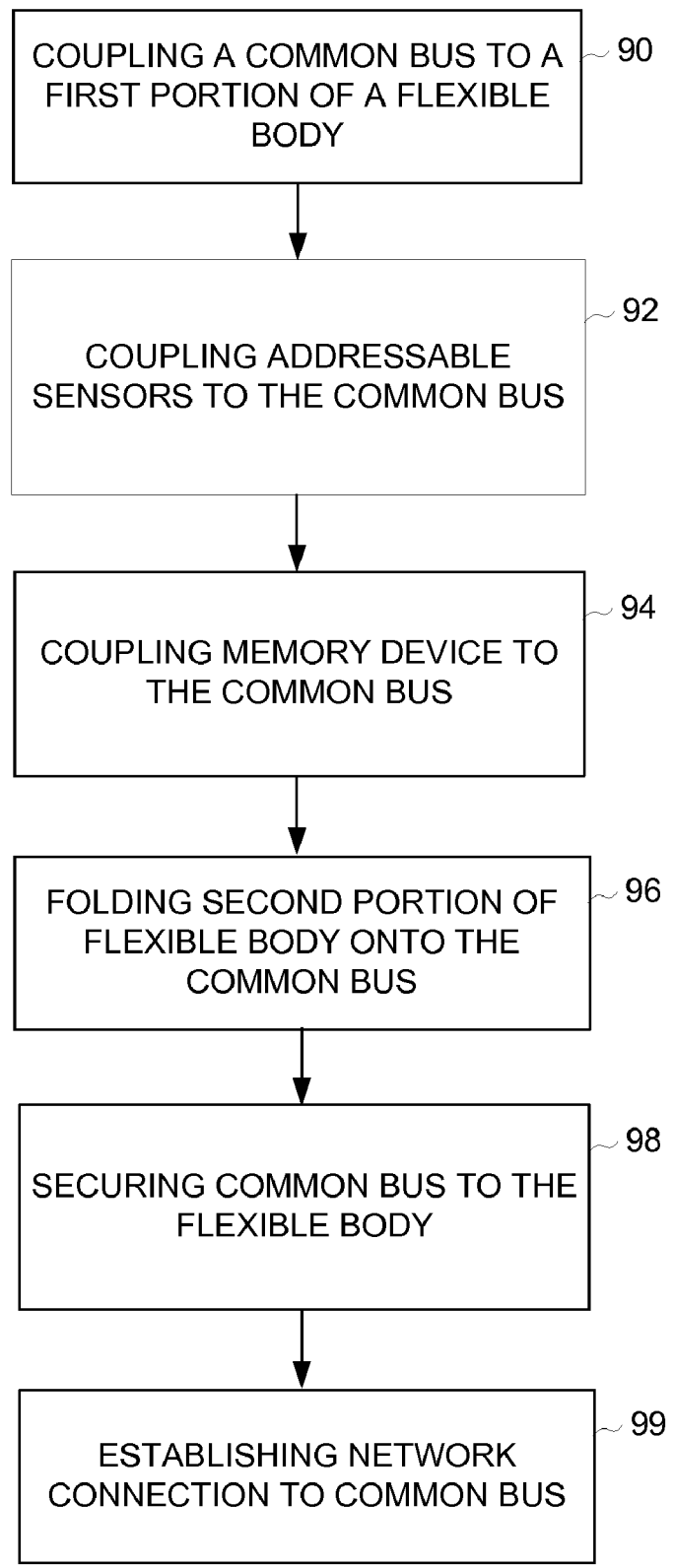
FIG. 9 is a logic flow diagram in accordance with an embodiment of the invention.

FIG. 9 provides the logical diagram illustrating the processes associated with manufacturing sensor assembly 10 shown in FIGS. 1 through 7. This involves first coupling a common bus to a first portion of a flexible body, such as first panel 28 of flexible body 12 within FIG. 1. In step 92, addressable sensors are communicatively coupled to the common bus. Additionally, step 94 couples a memory device, such as that of memory device 16 of FIGS. 1 through 7, to a common bus such as tape wire 18. In step 96, a second portion of the flexible body is folded onto the common bus. For example, flexible body 12 may be folded along the fold line that divides flexible body 12 into first panel 28 and second panel 30. In step 98, the common bus is secured to the second portion of the flexible body. This forms the sensor assembly that has been folded over as shown in FIGS. 3, 4A and 4B. Next, step 99 establishes a network connection to the common bus so that a network node or computer system may receive and interpret data associated with the addressable sensors.

Figure 10:
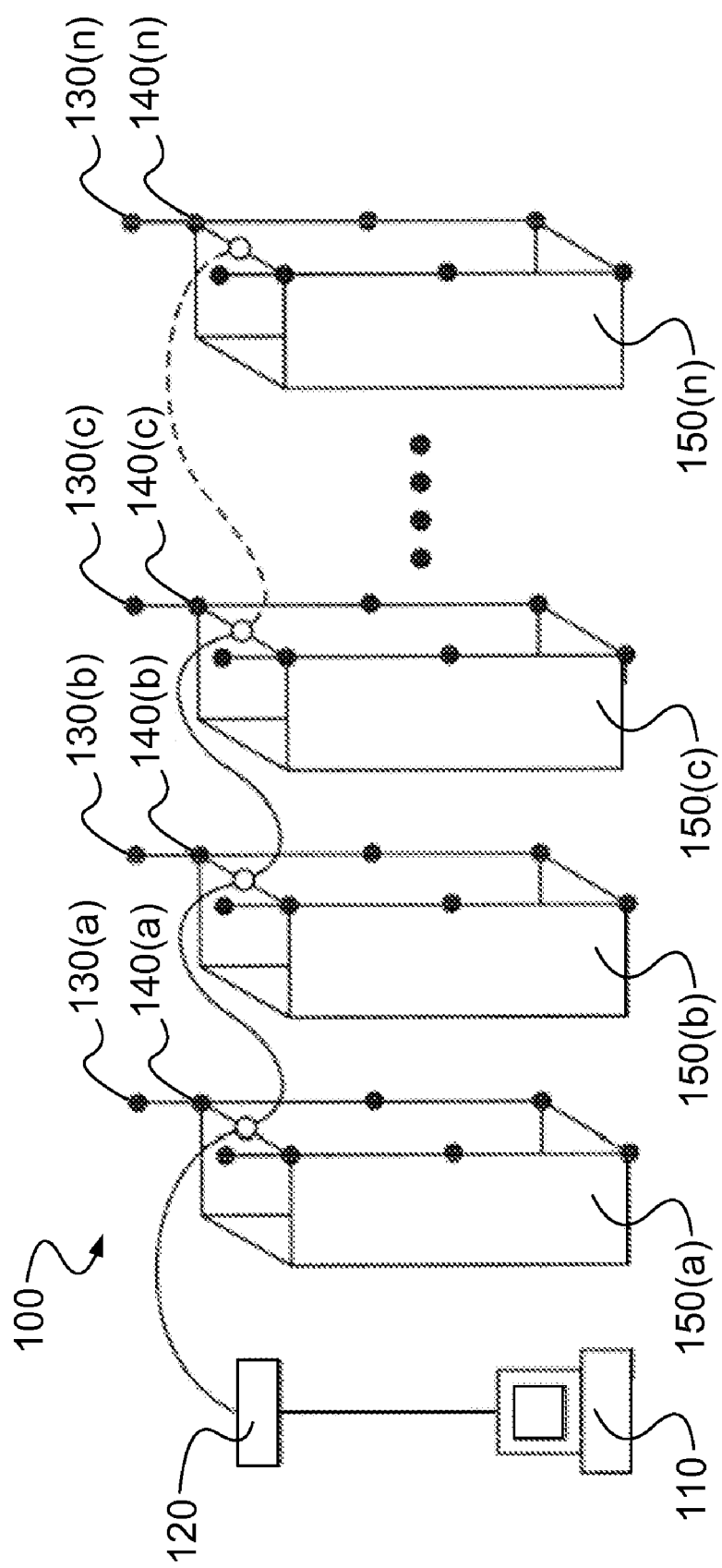
FIG. 10 is a schematic illustration of a rack system provided with sensors in accordance with an embodiment of the invention.
Figure 11:
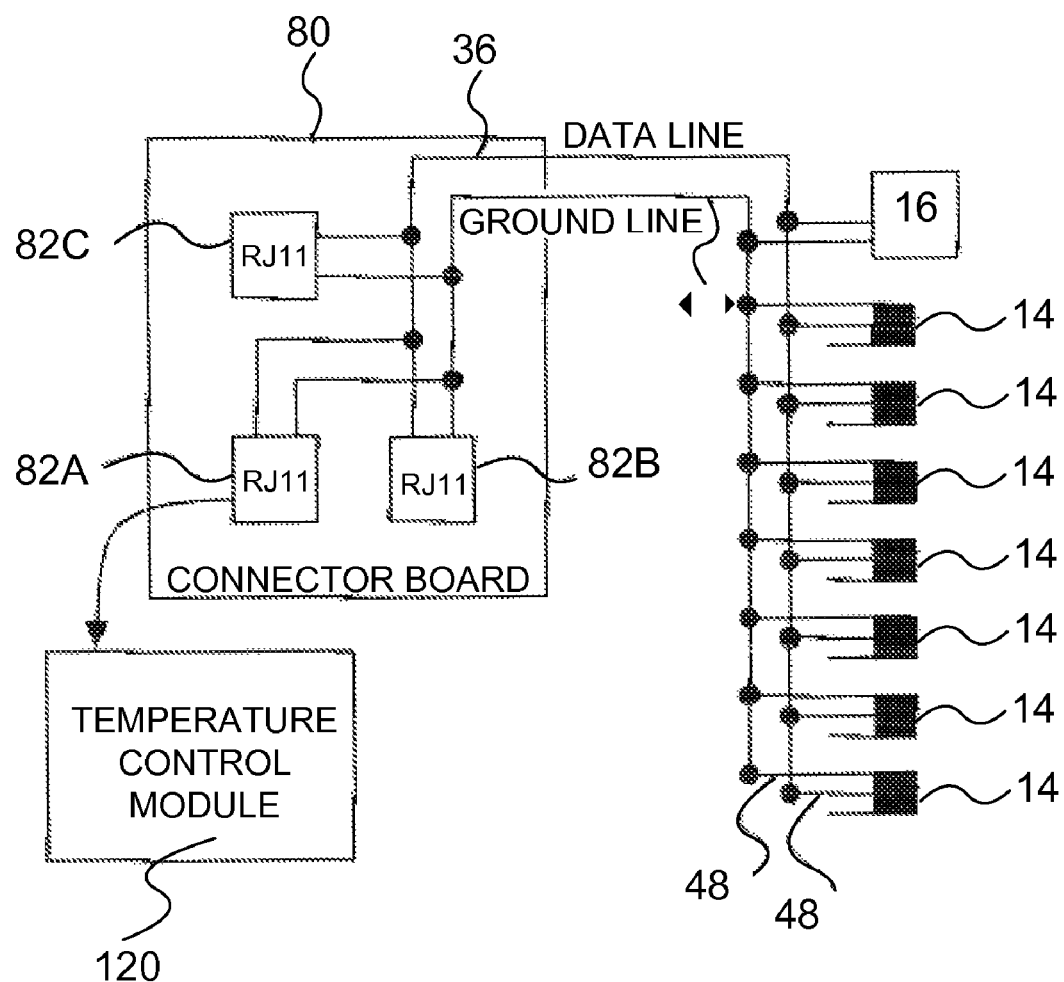
FIG. 11 shows a sensor connection scheme that can be implemented using the sensor assembly shown herein in accordance with an embodiment of the invention.

Sensor assembly 10 shown herein is compatible with "smart cooling" systems and their associated temperature data collection system. The various elements and aspects of a networked environmental monitoring system for collecting and using temperature data from a large number of sensors in a data center are depicted in FIGS. 10 through 11. In the context of "smart cooling," it is necessary to deploy a number of sensors on the front and rear surfaces of computer equipment racks. Provided in FIG. 10 is an illustration of one embodiment of system 100 for collecting temperature data that could incorporate sensor assembly 10 disclosed herein. The installation in which the temperature collection system is illustrated is a data center, though it will be apparent that the sensor assembly is not limited to use in data centers. The temperature collection system includes central computer system 110, temperature-collection module 120, a plurality of computer racks 150(a . . . n) wherein each of the plurality of computer racks includes a plurality of temperature sensors 130(a . . . n) and a connector board 140(a . . . n). The temperature-collection module is coupled to at least one of the connector boards, and to the central computer system.

The method of collecting temperature data using the system depicted in FIG. 10 involve the steps of coupling a number of sensors to at least one rack of systems. The number of sensors then interconnects to the central computer system or network. The central computer system or a network node then collects temperature data from each of the plurality of sensors, and controls the data center cooling system in accordance with that temperature information. Another implementation may utilize a microcontroller serving as a network node and mounted within each equipment or computer rack to serve the sensors data to the network via an Ethernet connection.

Computer system 110 may be any of a variety of different types, such as a notebook computer, a desktop computer, an industrial personal computer, an embedded computer, network node, etc. Computer system 110 includes a processing module and various other components such as a user interface (e.g. keyboard, mouse, voice recognition system, etc.), and an output device (e.g. a computer monitor, a television screen, a printer, etc.), depending upon the desired functions of the computer system. A communications port can also be coupled to the processor to enable the computer system to communicate with an external device or system, such as a printer, another computer, or a network. The processing module may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. Note that when the processing module implements one or more of its functions via a state machine, analog circuitry, digital circuitry, and/or logic circuitry, memory storing the corresponding operational instructions may be embedded within, or external to, the circuitry comprising the state machine, analog circuitry, digital circuitry, and/or logic circuitry.

Computer system 110 may also be utilized in conjunction with a distributed computing environment where tasks are performed by remote processing devices that are linked through a communications network. Examples of such distributed computing environments include local area networks of an office, enterprise-wide computer networks, and the Internet. Additionally, the networks could communicate via wireless means or any of a variety of communication means.

Each of the plurality of computer racks 150($a \ldots n$) of FIG. 6 includes a plurality of temperature sensors 130($a \ldots n$). Since the temperature profile of air throughout the system 100 is typically non-uniform, multiple sensors are implemented to capture temperature data at multiple points. In order to get an accurate profile of temperature or other conditions, any number of sensors can be deployed on or near each computer rack. In the configuration shown in FIG. 10, each rack in the data center is shown having 3 sensors on the front and 3 sensors on the rear of the rack case, with two additional overhead sensors disposed above the body of the rack. Other configurations may utilize any number of sensors. For example 5 sensors on the front and 5 sensors in the back may be employed without an overhead sensor. These sensors provide inputs into the control algorithms employed by "smart cooling" to manage the environment within the datacenter. However, other configurations can also be used. For example, the front sensor assembly shown in FIG. 7 includes three sensors on the center of the door of the rack, with no overhead sensors. The rear sensor assembly shown in FIG. 8 includes six sensors disposed inside the rear door of the rack, with an additional overhead sensor disposed above the rack. Other configurations are also possible.

Each sensor assembly 10 includes a connector wire 34 with a connector 20 at its end. Associated with each computer rack 60 is a connector board 80, like connector board 140 shown in FIG. 10. The connector wire from each sensor assembly connects to the connector board associated with the rack. In one simple configuration, the connector board needs no power and serves as a connection point for each of the plurality of sensors, and as a means for transmitting collected temperature data to the temperature collection module. FIG. 11 shows an example of a connector board and connection scheme that can be utilized in conjunction with various embodiments of the sensor assembly. The connector board includes at least two input ports 82. These first input ports are configured to connect, via connector 20, to a ground line and a data line associated with connector wire 34.

In one embodiment, input ports 82 can be RJ-11 phone line type ports or any of a variety of types of ports. As an operative example, data port 82A can be configured to connect connector board 80 to temperature collection module 110 or directly to central computer system 120, while data port 82B can be configured to connect to sensor assembly 10, to collect temperature data from the plurality of sensors 14. Additionally, data port 82A can be configured to connect the connector board to another connector board associated with another rack, thereby enabling multiple connector boards to be connected to a central computer system in a daisy chain fashion, like that shown in FIG. 10.

Data port 82C can also be provided to connect to a second sensor assembly (not shown) that can be associated with the rack. This sort of configuration is suggested by FIGS. 7 and 8. As shown in FIG. 7, connector wire 34 from the front sensor assembly is connected to the connector board. Likewise, a connector wire from the rear sensor assembly also extends to a connection point with the connector board. Consequently, a third or more additional input ports will be needed to provide connectivity to the interconnecting lines 84 that interconnect computer rack 60 to the central computer, network node, and/or other racks.

In the connection scheme shown in FIG. 11, the data leads and ground leads of temperature sensors 14 are coupled in parallel to the first and second RJ11 ports 82A, 82B via conductors 36 and 38. Memory device 16 is also connected to the data and ground lines at the head of the line of sensors. As a result, the plurality of sensors is connected in parallel to temperature collection module 120 via the data line and the ground line. This concept is advantageous with respect to conventional methodology in that conventional methodology suggests a point-to-point connection from each sensor to a central data collection system. By employing the above-described concepts, multiple temperature sensors are coupled to a central data collection system (the temperature collection module) via the data line and the ground line. This is substantially more efficient than conventional methodology, and allows the temperature sensors to be installed during production and connected together in the field.

Returning to FIG. 10, temperature collection module 120 couples to central computer system 110 or network node and at least one of the connector boards 140($a \ldots n$). The temperature collection module can be included in the central computer system or network node or can be configured in a device separate from the central computer system. In accordance with an embodiment, the temperature collection module collects temperature data from each plurality of temperature sensors 130($a \ldots n$). The temperature collection module includes connector board interface electronics, temperature collection logic, and central computer system interface electronics. The connector board interface electronics are coupled to the temperature collection logic wherein the temperature collection logic is further coupled to the central computer system interface electronics. The temperature collection logic is further coupled to a temperature data table that maintains the readings of the sensors. One of ordinary skill in the art will readily recognize the elements and features of the temperature collection module can be configured in a variety of ways.

The temperature collection logic periodically queries the data table which contains the temperature readings of each plurality of the sensors. In order to access individual sensors it is necessary to know the address identifier of each of the individual sensors along with the physical location. This issue is complicated by the fact that the individual sensors are factory programmed with unique address information that is not re-programmable. However, this problem is solved by the memory device associated with each sensor assembly. The memory device stores the identifier of each sensor on the sensor assembly. The memory devices are programmed during the assembly of the sensor assembly. Data is stored in the memory device that indicates a unique identifying number for the sensor assembly itself. Also stored in the memory are the unique 1-wire addresses of each sensor device installed on the sensor assembly. These addresses are stored in a table in the same order as the physical order of the devices on the sensor assembly. It would also be possible to associate the sensor assembly with a particular rack if it was installed on this rack at the factory. Alternatively the rack information could be programmed in the field using a simple tool designed for this purpose. Using this information, it is possible for a temperature collection module to automatically configure its data collection logic when a sensor assembly is added to its 1-wire network.

In accordance with one method of collecting temperature data, a temperature data acquisition process can begin with the periodic querying of each of the sensors in the data center, providing a "start" command whereby the process of taking temperature readings from the individual sensors is initiated. Currently, this process takes approximately ¾ to one second per sensor when using the parasitically powered sensor devices described above. If faster results are desired, sensors are available with a separate power supply pin for a much faster response. This would be one configuration in which three conductors in the sensor assembly and in the connecting wire would be needed.

Once the temperature is measured from each sensor, temperature collection logic stores the temperature readings in a data table and generates a temperature profile of the data center based on the temperature readings. Separate temperature tables can be generated based on the varying locations of sensors. For example, based on the location of the sensors temperature profiles can be generated for the front of the rack, the back of the rack, etc.

In varying embodiments, the data center could employ more than one temperature collection module. In this case, the data table in each module will only contain part of the temperature profile of the data center. Accordingly, the central computer can assemble partial profiles of the data center. These partial profiles can subsequently be combined to form a global temperature profile of the data center.

The method of obtaining temperature data from an installation of sensors is generally as follows. A first step includes periodically querying of each of the sensors in the data center. A second step includes providing an initiation command. A third step includes reading the measured temperature of each of the sensors. A final step involves generating a temperature profile of the data center based on the temperature readings. The temperature profile can include a variety of profiles based on the locations of the sensors, and can be presented in a 3-dimensional matrix view format. The above-described method may be implemented, for example, by operating a computer system to execute a sequence of machine-readable instructions. The instructions may reside in various types of computer readable media.

The sensor assembly substantially addresses the manufacturing and installation requirements for networked environmental sensors. The sensor assembly provides a system for deploying a widely distributed sensor network with simple parallel wiring. The labor-intensive and costly installation process of traditional temperature measurement is replaced by an unobtrusive, easily installed assembly. Separate specialized electrical connections are replaced by a single parallel circuit of standard telecommunications-grade wiring. Advantageously, the sensor assembly provides broad sensor coverage in an easily installed package. The sensor assembly can be produced at a low cost, and is easily manufactured using existing assembly techniques.

Cost effective networks of digital sensors have many advantages over traditional sensor systems. Systems sometimes referred to as "smart cooling" systems, developed to provide a networked environmental monitor, typically utilize a number of temperature sensors, and located at various locations throughout a data center, to dynamically collect temperature data at various locations within the data center. By dynamically collecting temperature data at various locations within the data center, the cooling resources of the data center can be allocated based on the actual cooling requirements of the data center. As a result, substantial savings in operational costs related to the operation of the data center cooling resources is possible.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

Although the application and use of the sensor assembly is disclosed in the context of a data center, one of ordinary skill in the art will readily recognize that the functionality of the varying embodiments of the sensor assembly can be utilized in a variety of different facilities. Specifically, this type of sensor assembly is by no means limited to data center applications, and is not limited to temperature sensing.

It is to be understood that the above-referenced arrangements are illustrative of the application of the principles of the present invention. It will be apparent to those of ordinary skill in the art that numerous modifications can be made without departing from the principles and concepts of the invention as set forth in the claims.

What is claimed is:

1. A network sensor assembly comprising:
   a panel configured for mounting on a surface;
   a plurality of addressable sensors coupled to the panel that sense environmental conditions at the surface;
   a memory device that stores configuration information associated with the plurality of addressable sensors;
   a bus communicatively coupled to the plurality of addressable sensors and the memory device and configured for communicatively coupling the network sensor assembly to a network node for communicating data associated with the sensed environmental conditions in a network; and
   the panel comprising a folding panel that folds at a fold line about the bus.

2. The network sensor assembly according to claim 1 further comprising:
   a plurality of protective tabs coupled to the panel and respectively coupled to the plurality of addressable sensors in a configuration that supports and protects the addressable sensor plurality.

3. The network sensor assembly according to claim 1 further comprising:
   a plurality of mounting tabs coupled to the panel configured to secure the network sensor assembly to the surface.

4. The network sensor assembly according to claim 1 further comprising:
   a plurality of protective tabs cut from the folding panel positioned to support and protect the plurality of addressable sensors;
   an adhesive coupling the panel to the bus.

5. The network sensor assembly according to claim 1 wherein the bus comprises a multiple conductor tape wire.

6. The network sensor assembly according to claim 1 wherein the plurality of addressable sensors sense at least one environmental condition selected from the group consisting of temperature, humidity, air pressure, air velocity, smoke sensors, occupancy sensors, computer rack door condition, sound, and light.

7. The network sensor assembly according to claim 1 further comprising: the network node configured for communicating data associated with the sensed environmental conditions in a network.

8. The network sensor assembly according to claim 1 further comprising: application software recorded on a non-transitory computer readable medium that operates on data received from the network node associated with the sensed environmental conditions in a network, the application software configured to:
   periodically query the plurality of addressable sensors from a plurality of network nodes;
   reading sensed environmental conditions from the plurality of addressable sensors from the plurality of network nodes;
   generate an environmental profile of a data center based on the sensed environmental conditions.

9. A method of fabricating a network sensor assembly comprising:
   mechanically coupling a bus to a panel configured for mounting on a surface, the panel comprising a folding panel that folds at a fold line about the bus;
   mechanically coupling a plurality of addressable sensors to the panel;
   communicatively coupling the bus to the plurality of addressable sensors that sense environmental conditions at the surface;
   communicatively coupling the bus to a memory device that stores configuration information associated with the plurality of addressable sensors; and
   communicatively coupling the memory device and the plurality of addressable sensors to a network node for communicating data associated with the sensed environmental conditions in a network.

10. The method according to claim 9 further comprising:
   coupling a plurality of protective tabs to the panel and respectively to the plurality of addressable sensors; and
   configuring the protective tab plurality to support and protect the addressable sensor plurality.

11. The method according to claim 9 further comprising:
   coupling a plurality of mounting tabs to the panel; and
   configuring the mounting tab plurality to secure the network sensor assembly to the surface.

12. The method according to claim 9 further comprising:
   cutting a plurality of protective tabs from the folding panel;
   positioning the protective tab plurality to support and protect the plurality of addressable sensors;
   coupling the panel to the bus with adhesive.

13. A network environmental monitor comprising:
   at least one network sensor assembly comprising:
      a panel configured for mounting on a surface, the panel comprising a folding panel that folds at a fold line about a bus;
      a plurality of addressable sensors coupled to the panel that sense environmental conditions at the surface;
      a memory device that stores configuration information associated with the plurality of addressable sensors; and
      the bus communicatively coupled to the plurality of addressable sensors and the memory device, the bus configured for communicating data associated with the sensed environmental conditions;
   at least one network node communicatively coupled to the at least one network sensor assembly wherein the bus communicatively couples the at least one network sensor assembly to the at least one network node and the at least one network node distributes data associated with the sensed environmental conditions over a network; and
   a processor communicatively coupled to the at least one networked node configured to execute a software application, recorded on a non-transitory computer readable medium, that collects sensed environmental condition data from the plurality of addressable sensors and controls environment based on the sensed environmental condition data.

14. The environmental monitor according to claim 13 a wherein the software application determines sensed environmental conditions at a computer rack and adjusts environmental conditions at the computer rack based on the sensed environmental conditions at the computer rack.

15. The environmental monitor according to claim 13 further comprising:
   a plurality of equipment racks, the plurality of network sensor assemblies respectively mounted on the equipment rack plurality.

16. The environmental monitor according to claim 15 wherein the equipment rack plurality is contained within a data center.

17. The environmental monitor according to claim 16 further comprising:
   an environmental control system communicatively coupled to the at least one network node that adjusts environmental controls of the data center based on the sensed environmental conditions at the plurality of equipment racks.

18. The environmental monitor according to claim 17 wherein the environmental conditions sensed comprise at least one condition selected from the group consisting of temperature, humidity, air pressure, air velocity, smoke sensors, occupancy sensors, computer rack door condition, sound, and light.

19. The environmental monitor according to claim 13 wherein the at least one network sensor assembly further comprises:
   a plurality of protective tabs coupled to the panel and respectively coupled to the plurality of addressable sensors in a configuration that supports and protects the addressable sensor plurality.

20. The environmental monitor according to claim 13 further comprising:
   application software recorded on a non-transitory computer readable medium and executable on the processor that operates on data received from the network node associated with the sensed environmental conditions in a network, the application software configured to:
      periodically query the plurality of addressable sensors from a plurality of network nodes;
      read sensed environmental conditions from the plurality of addressable sensors from the plurality of network nodes;
      generate an environmental profile of a data center based on the sensed environmental conditions.

* * * * *

UNITED STATES PATENT AND TRADEMARK OFFICE
CERTIFICATE OF CORRECTION

| | | |
|---|---|---|
| PATENT NO. | : 8,046,196 B2 | Page 1 of 1 |
| APPLICATION NO. | : 12/114673 | |
| DATED | : October 25, 2011 | |
| INVENTOR(S) | : Chris F. Felcman et al. | |

It is certified that error appears in the above-identified patent and that said Letters Patent is hereby corrected as shown below:

In column 14, line 19, in Claim 14, before "wherein" delete "a".

Signed and Sealed this
Twenty-sixth Day of June, 2012

David J. Kappos
*Director of the United States Patent and Trademark Office*